(12) United States Patent
Tanabe

(10) Patent No.: US 8,390,386 B2
(45) Date of Patent: Mar. 5, 2013

(54) VARIABLE INDUCTOR

(75) Inventor: Akira Tanabe, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 51 days.

(21) Appl. No.: 12/662,678

(22) Filed: Apr. 28, 2010

(65) Prior Publication Data

US 2010/0295625 A1 Nov. 25, 2010

(30) Foreign Application Priority Data

May 25, 2009 (JP) .................................. 2009-125579

(51) Int. Cl.
*H03K 3/354* (2006.01)
(52) U.S. Cl. .............. 331/117 FE; 331/117 R; 331/167; 331/181
(58) Field of Classification Search ............. 331/116 M, 331/117 FE, 117 R, 167, 181
See application file for complete search history.

(56) References Cited

U.S. PATENT DOCUMENTS

| 5,872,489 A * | 2/1999 | Chang et al. .................. 331/179 |
| 7,091,784 B1 * | 8/2006 | Terrovitis ....................... 330/252 |
| 2004/0183606 A1 * | 9/2004 | Komurasaki et al. ..... 331/117 R |
| 2007/0018767 A1 * | 1/2007 | Gabara .......................... 336/200 |
| 2007/0085617 A1 * | 4/2007 | Salerno .......................... 331/167 |

FOREIGN PATENT DOCUMENTS

| JP | 7-142258 | 6/1995 |
| JP | 8-45744 | 2/1996 |
| JP | 2007-5498 | 1/2007 |

* cited by examiner

*Primary Examiner* — Robert Pascal
*Assistant Examiner* — Jeffrey Shin
(74) *Attorney, Agent, or Firm* — McGinn IP Law Group, PLLC

(57) ABSTRACT

A variable inductor includes: a first inductor having two ends connected to a first terminal and a second terminal; a second inductor having two ends connected to the first terminal and the second terminal; a first node provided on the first inductor; a second node provided on the second inductor; and a switch element that switches between a conductive state and a non-conductive state between the first node and the second node.

23 Claims, 22 Drawing Sheets

VARIABLE INDUCTOR

TECHNICAL FIELD

Reference to Related Application

This application is based upon and claims the benefit of the priority of Japanese patent application No. 2009-125579, filed on May 25, 2009, the disclosure of which is incorporated herein in its entirety by reference thereto.
The present invention relates to a variable inductor, and in particular to an on-chip variable inductor.

BACKGROUND

In recent years various kinds of high speed digital wireless systems, such as mobile telephony, wireless LAN, Bluetooth, digital terrestrial television and the like, are being realized. Moreover, among digital semiconductor integrated circuits, analog technology similar to wireless circuitry is used in those that operate at high speeds of a GHz and above. In these circuits, an on-chip inductor formed on a semiconductor substrate is used as a passive device. The on-chip inductor is formed from metal wiring wound in a spiral shape in a semiconductor.

The on-chip inductor is much used as a part of a resonant circuit in an analog circuit. By connecting an inductor and a capacitor in series or in parallel to cause resonance, with a resonant frequency $f_0$ determined by an inductance L of the inductor and a capacitance C of the capacitor, the resonance frequency being given by:

$$f_0 = \frac{1}{2\pi\sqrt{LC}} \quad (1)$$

the resonant circuit exhibits effects of high gain, impedance matching, oscillation, and the like. However, since resonance only occurs at frequencies in a narrow band close to the resonant frequency, in order to make a resonant circuit that operates at a variety of frequencies, it is necessary to change the resonant frequency. To change the resonant frequency $f_0$, the inductance L or the capacitance C must be changed.

FIG. 20 is a circuit diagram of an amplifier that uses a resonant circuit. Referring to FIG. 20, a load formed of an inductor Ls and a capacitor Cs is connected to a MISFET M0. With transconductance of the MISFET M0 as Gm, and series resistance of the inductor Ls as Rs, if the series resistance of the capacitor Cs and parasitic capacitance outside of the capacitor Cs are ignored, gain G of the amplifier is:

$$G = Gm \times \left(\frac{1}{\omega^2 Cs^2 Rs} + j\frac{1}{\omega Cs Rs}\right) = Gm \times \left(\frac{\omega^2 Ls^2}{Rs} + j\frac{\omega Ls}{Rs}\right) \quad (2)$$

Here, the following holds:

$$\omega = \frac{1}{\sqrt{LsCs}}$$

As long as there is no particular limitation, the inductance of the inductor is represented by a reference symbol the same as the inductor; the capacitance of the capacitor is represented by a reference symbol the same as the capacitor; and the resistance of a resistive element is represented by a reference symbol the same as the resistive element.

From Equation (2), the gain G of the amplifier decreases when the capacitance Cs is increased, and increases when the inductance Ls is increased. From Expression (1), in a case where the resonant frequency is changed by fixing the inductance Ls and changing the capacitance Cs, the gain G decreases on a low frequency side in which the capacitance Cs increases. Conversely, in a case where the capacitance Cs is fixed and the inductance Ls is changed, if the inductance Ls is increased, the gain G can be increased on the low frequency side.

In general, a method of changing the capacitance Cs is used in changing the resonant frequency $\omega$. By a device such as a varactor using a p-n junction, a variable capacitor can be easily implemented on-chip. By Equation (2), it is desirable, with regard to a circuit characteristic, to change the inductance Ls, but with a conventional variable inductor, when the inductance Ls is changed, the series resistance Rs of the inductor Ls increases.

Next, a description is given concerning conventional variable inductance. FIG. 21 shows an equivalent circuit of a conventional magnetic field based variable inductor. On the other hand, FIG. 22 shows an equivalent circuit of a conventional switch based variable inductor.

Referring to FIG. 21, the magnetic field based variable inductor has a transformer formed of inductors LM1 and LM2. By connecting an n-type MISFET M1 to the inductor LM2 side, and changing an ON resistance, it is possible to change the inductance viewed from the two sides of the inductor LM1. Here, self-inductances of the inductors LM1 and LM2 are LM1 and LM2 respectively; mutual inductance of the inductor LM1 and the inductor LM2 is M; ON resistance of the MISFET M1 is R30; and series resistances of the inductances LM1 and LM2 are RM1 and RM2 respectively.

In this case, the inductance and the series resistance viewed from the two ends on the inductance LM1 side, in a case where the MISFET M1 is OFF, are as follows:

Inductance LM1

Resistance RM1 (3)

On the other hand, in a case where the MISFET M1 is ON, $$\text{Inductance} \ldots LM1 - \left(\frac{\omega^2 k^2 LM1 LM2}{\omega^2 LM2^2 + (RM2 + R30)^2}\right) LM2 \quad (4)$$

$$\text{Resistance} \ldots RM1 + \left(\frac{\omega^2 k^2 LM1 LM2}{\omega^2 LM2^2 + (RM2 + R30)^2}\right) RM2$$

Here, a coupling coefficient k is $$k = \frac{M}{\sqrt{LM1 LM2}}$$

Referring to FIG. 22, the switch based variable inductor (for example, Patent Document 2) has two inductors LS1 and LS2, and these inductors are connected by an n-type MISFET M1 and a p-type MISFET M2. By turning only one of the MISFETs M1 and M2 ON by a control signal added to a control terminal CNT, it is possible to have the inductance viewed from the two sides as LS1 or LL1+LS2. An inductance that the switch based inductor can have is only the two values LS1 or LS1+LS2, and it is not possible to change the inductance analogically so as to have an intermediate value therebetween. However, in the switch based inductor it is possible to greatly change the inductance, in comparison to the magnetic field based inductor.
[Patent Document 1]
JP Patent Kokai Publication No. JP2007-005498A
[Patent Document 2]
JP Patent Kokai Publication No. JP-H07-142258A
[Patent Document 3]
JP Patent Kokai Publication No. JP-H08-045744A

SUMMARY

The entire disclosure of Patent Documents 1, 2, and 3 is incorporated herein by reference thereto.
The following analysis was carried out by the present inventors. A coupling coefficient k for the abovementioned magnetic field based inductor represents degree of coupling of LM1 and LM2 of a transformer, and has a value of 0 to 1. The amount of change of inductance can be changed by the coupling coefficient k. By Equation (4), in order to increase the amount of change of the inductance, it is necessary to increase k.

However, in an on-chip inductor formed on a semiconductor substrate, it is not possible to increase the coupling coefficient k so much. Furthermore, when the coupling coefficient k is large, according to Equation (4), the ON resistance increases. Consequently, to inhibit the increase of the ON resistance, it is necessary to decrease the coupling coefficient k or to decrease the ratio LM1/LM2. That is, with a magnetic field based variable inductor, there is a problem in that when the amount of change of the inductance is increased, the series resistance of the inductor increases.

On the other hand, with a switch based variable inductor, since MISFETs M1 and M2 are connected in series to inductors LS1 and LS2, when the ON resistance of the MISFETs M1 and M2 are increased, Q value decreases with an increase in the series resistance. Therefore, a gate width of the MISFETs M1 and M2 must be, for example, about a few mm, and there is a problem in that chip area and parasitic capacitance increase.

From the above, it is difficult to greatly change inductance, with the magnetic field based variable inductor. On the other hand, there is a problem in that, with the switch based variable inductor, the series resistance of the inductor increases due to ON resistance of a switch.
Consequently, with regard to the variable inductor, there is a need in the art to increase the amount of change of inductance while preventing an increase in series resistance.

According to a first aspect of the present disclosure, there is provide a variable inductor including: a first inductor having two ends connected to a first terminal and a second terminal; a second inductor having two ends connected to the first terminal and the second terminal; a first node provided on the first inductor; a second node provided on the second inductor; and a switch element that switches between a conductive state and a non-conductive state between the first node and the second node.

According to a second aspect of the present disclosure, there is provided a variable inductor including: a first inductor having two ends connected to a first terminal and a second terminal; a second inductor having two ends connected to the first terminal and the second terminal; a first node provided on the first inductor; a second node provided on the first inductor at a position different from the first node; and a switch element that switches between a conductive state and a non-conductive state between the first node and the second node.

According to a third aspect of the present disclosure, there is provided a variable inductor including: a first inductor having two ends connected to a first terminal and a second terminal; a second inductor having two ends connected to the first terminal and the second terminal; n switch elements, where n is a natural number; n nodes provided on the first inductor; and n nodes provided on the second inductor. An i-th switch element, where i is a natural number from 1 to n, among the n switch elements switches between a conductive state and a non-conductive state between an i-th node counted from the first terminal of the first inductor and an i-th node counted from the second terminal of the second inductor.

According to a fourth aspect of the present disclosure, there is provided a variable inductor including: a first inductor having two ends connected to a first terminal and a second terminal; a second inductor having two ends connected to the first terminal and the second terminal; n switch elements, where n is a natural number and is an even number; n nodes provided on the first inductor; and n nodes provided on the second inductor. An i-th switch element, where i is a natural number from 1 to n/2, among the n switch elements switches between a conductive state and a non-conductive state between an i-th node counted from the first terminal of the first inductor and an i-th node counted from the second terminal of the first inductor, and an (i+n/2)-th switch element, where i is a natural number from 1 to n/2, among the n switch elements switches between a conductive state and a non-conductive state between an i-th node counted from the first terminal of the second inductor and an i-th node counted from the second terminal of the second inductor.

The present invention provides the following advantage, but not restricted thereto. According to the variable inductor of the present invention, it is possible to increase the amount of change of inductance while preventing an increase in series resistance.

PREFERRED MODES

Figure 1:
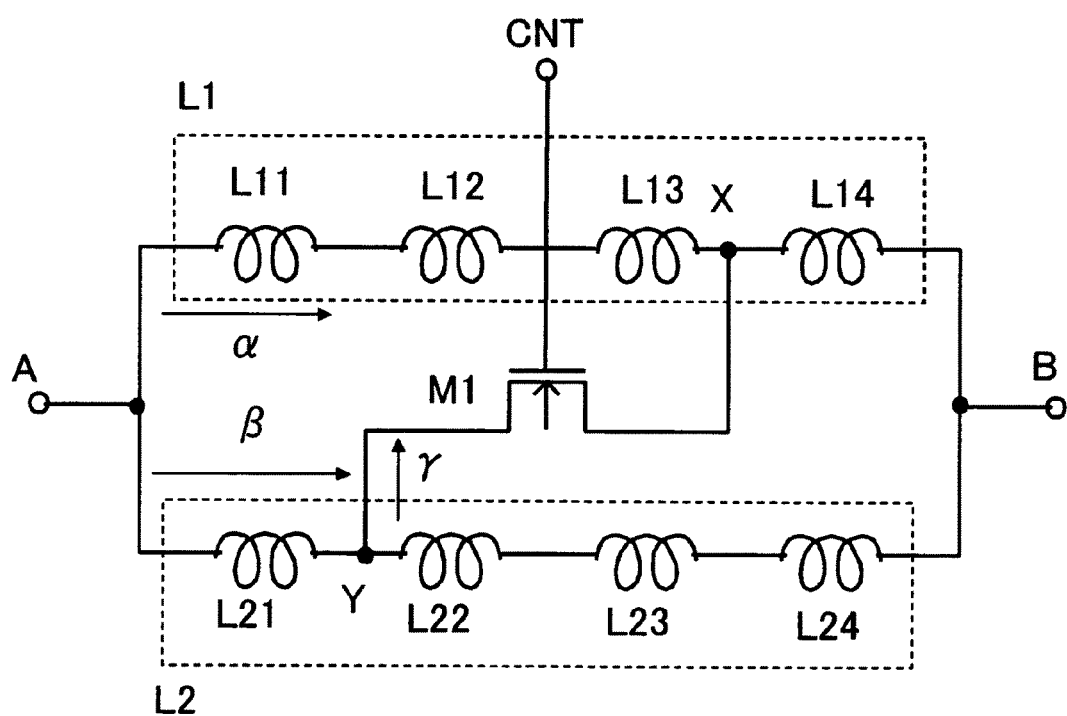
FIG. 1 is a circuit diagram showing an equivalent circuit of a variable inductor according to a first exemplary embodiment.

In the present disclosure, there are possible modes, which include the following, but not restricted thereto.

A variable inductor in a first mode is preferably a variable inductor according to a first aspect as described above.

With respect to a variable inductor in a second mode, in the variable inductor according to the abovementioned first aspect, inductance of a first inductor and inductance of a second inductor are preferably equal, and inductance between a first terminal and a first node, and inductance between a second terminal and a second node are preferably equal.

A variable inductor in a third mode is preferably a variable inductor according to a second aspect as described above.

With respect to a variable inductor in a fourth mode, in the variable inductor according to the abovementioned second aspect, inductance of a first inductor and inductance of a second inductor are preferably equal, and inductance between a first terminal and a first node, and inductance between a second terminal and a second node are preferably equal.

A variable inductor in a fifth mode is preferably a variable inductor according to a third aspect as described above.

A variable inductor in a sixth mode preferably puts a plurality of switch elements, among n switch elements, simultaneously in a conductive state, or simultaneously in a non-conductive state.

A variable inductor in a seventh mode is preferably a variable inductor according to a fourth aspect as described above.

In a variable inductor in an eighth mode, a first inductor and a second inductor, respectively, preferably include a plurality of inductors connected in series.

In a variable inductor in a ninth mode, a switch element or a plurality of switch elements may respectively be any of a MISFET, a MESFET, and a bipolar transistor.

In a variable inductor in a tenth mode, a switch element or a plurality of switch elements, respectively, is or are connected in parallel to two elements, whose polarity is mutually different, of any of a MISFET, a MESFET, and a bipolar transistor, and signals of reverse polarity are preferably received by control terminals of the two elements that have mutually different polarity.

In a variable inductor in an eleventh mode, a first inductor and a second inductor may have a mutually symmetrical form.

In a variable inductor in an twelfth mode, a first inductor and a second inductor may be respectively disposed in a concentric form.

In a variable inductor in a thirteenth mode, a first inductor and a second inductor may be respectively arranged extending over a plurality of metal wiring layers.

A semiconductor device in a fourteenth mode preferably has a circuit including the abovementioned variable inductor on a semiconductor substrate.

An oscillator circuit in a fifteenth mode preferably has the abovementioned variable inductor, a capacitor element having two ends connected to a first terminal and a second terminal, and an inverter circuit that oscillates at a resonant frequency due to the variable inductor and the capacitor element.

A semiconductor device in a sixteenth mode preferably has the abovementioned oscillator circuit on a semiconductor substrate.

First Exemplary Embodiment

A description is given concerning a variable inductor according to a first exemplary embodiment, making reference to the drawings. FIG. 1 is a circuit diagram showing an equivalent circuit of the variable inductor according to the present exemplary embodiment.

Referring to FIG. 1, the variable inductor has two inductors L1 and L2. The inductors L1 and L2, both ends of which are shorted at terminals A and B, function as a whole as one inductor. Referring to FIG. 1, 8 inductors L11 to L14 and L21 to L24 are shown. The inductors L11 to L14 and L21 to L24 are part of one line of inductors L1 and L2, respectively connected in series. A description is given below concerning a case where the inductors L1 and L2 are symmetrical inductors, but the present invention can also be applied to a case where the inductors L1 and L2 are non-symmetrical.

A connection part of inductors L13 and L14 is a node X, a connection part of inductors L23 and L24 is a node Y, and a source and a drain of a MISFET M1 are connected to these nodes. ON and OFF states of the MISFET M1 are controlled by voltage of a control signal for a control terminal CNT. Here, a switch element is the MISFET M1, but a bipolar element or a MESFET may also be used as other elements that can be realized on-chip. According to the MISFET M1 being ON or OFF, it is possible to change series inductance between the terminals A and B. Furthermore, in the drawing the MISFET M1 is an n-type, but a p-type of MISFET may also be used, and n-type and p-type MISFETs may be connected in parallel.

Next, a description is given concerning operation of the variable inductor for a case of a switch being ON and a case of the switch being OFF.

Figure 2A:
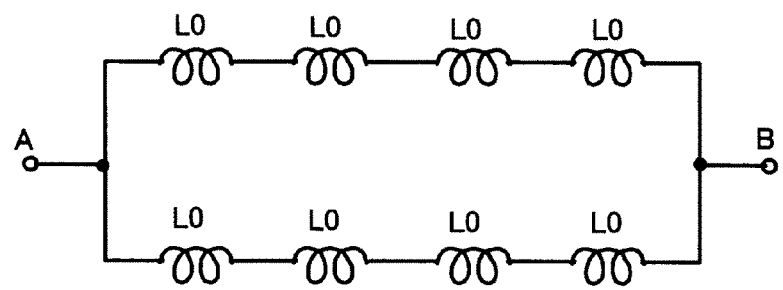
FIGS. 2A and 2B are circuit diagrams showing an equivalent circuit according to a switch state of a variable inductor according to the first exemplary embodiment.
Figure 2B:
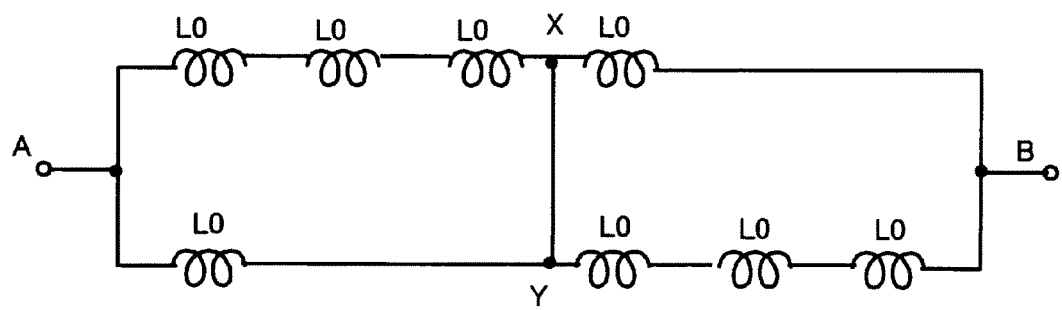

FIGS. 2A and 2B are circuit diagrams showing an equivalent circuit corresponding to a state of the switch of the variable inductor according to the present exemplary embodiment. FIG. 2A is a circuit diagram showing the equivalent circuit when the MISFET M1 is OFF, in the variable inductor, and FIG. 2B is a circuit diagram showing the equivalent circuit when the MISFET M1 is ON. Here, inductance of all of the inductors L11 to L14 and the inductors L21 to L24 is L0, and ON resistance of the MISFET M1 is ignored.

Referring to FIG. 2A, in a state where the MISFET M1 is OFF, the entire series inductance between the terminals A and B is 2*L0. On the other hand, referring to FIG. 2B, in a state where the MISFET M1 is ON, the entire series inductance is 1.5*L0. Therefore, in the variable inductor of the present exemplary embodiment, it is possible to vary the inductance.

In the variable inductor of the present exemplary embodiment, an active device (the MISFET M1) for changing the inductance is used. In a conventional variable inductor, an inductor and a switch are connected in series, and since all current flowing in the inductor passes through the switch, influence of the series resistance of the switch is larger. On the other hand, in the variable inductor of the present exemplary embodiment, since part of the current flowing in the inductor is bypassed to pass through the switch, the influence of series resistance of the switch is small.

Furthermore, with regard to the inductors L1 and L2 themselves, even when characteristics viewed from the two ends are not equal, that is, for non-symmetrical inductors, by symmetrically disposing the inductors L1 and L2, so that L11=L24, L12=L23, L13=L22, and L14=L21, so that by combining as a whole the inductors L1 and L2, characteristics viewed from the terminals A and B are equal, and it is possible to configure symmetrical inductors. That is, it is possible to have symmetrical inductors by combining the non-symmetrical inductors. By having inductor symmetricity, it is possible to increase circuit symmetricity in a differential circuit.

Second Exemplary Embodiment

Figure 3:
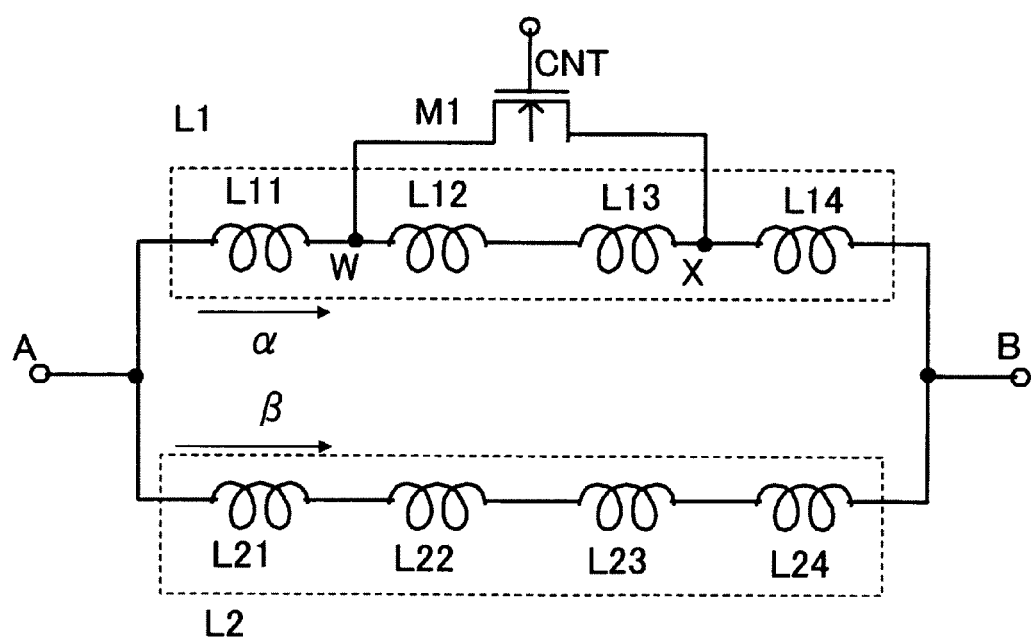
FIG. 3 is a circuit diagram showing an equivalent circuit of a variable inductor according to a second exemplary embodiment.

A description is given concerning a variable inductor according to a second exemplary embodiment, making reference to the drawings. FIG. 3 is a circuit diagram showing an equivalent circuit of the variable inductor according to the present exemplary embodiment.

Referring to FIG. 3, the variable inductor of the present exemplary embodiment has two inductors L1 and L2, similar to the variable inductor of the first exemplary embodiment. The inductors L1 and L2, both ends of which are shorted at terminals A and B, function as a whole as one inductor. Inductors L11 to L14 and L21 to L24 are part of one line of inductors L1 and L2, respectively connected in series.

A connection part of inductors L13 and L14 is a node X, a connection part of inductors L11 and L12 is a node W, and a source and a drain of a MISFET M1 are connected to these nodes. According to the MISFET M1 being ON or OFF, it is possible to change series inductance between the terminals A and B. Here, a switch element is the MISFET M1, but, as an element that can be realized on-chip, a bipolar element or a MESFET are also possible. Furthermore, the MISFET M1 may be an n-type MISFET, or may be a p-type MISFET.

Here, inductance of all of the inductors L11 to L14 and L21 to L24 is L0, and ON resistance of the MISFET M1 is ignored. In this case, inductance between the terminals A and B of the variable inductor is 2*L0 when the MISFET M1 is OFF, and is (4/3)*L0 when the MISFET M1 is ON.

Figure 4:
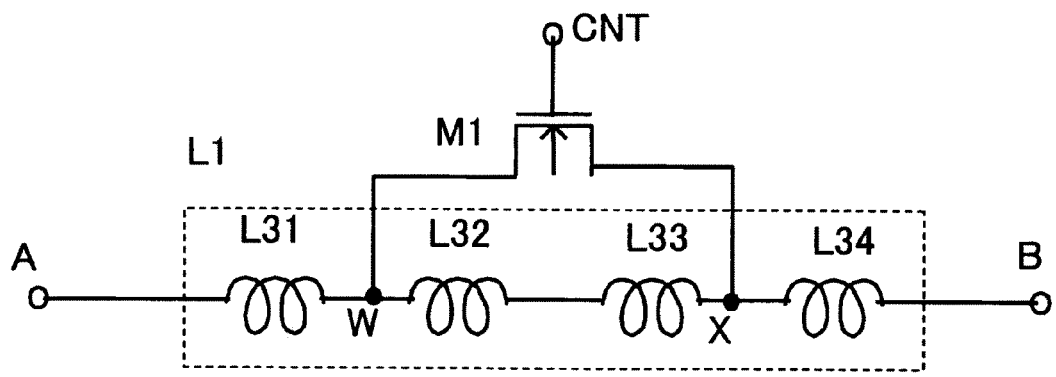
FIG. 4 is a circuit diagram showing an equivalent circuit of a conventional variable inductor.

Next, a description is given concerning an effect in which series resistance is decreased by the variable inductor according to the present invention, while comparing with a conventional variable inductor. FIG. 4 is a circuit diagram showing an equivalent circuit of a conventional switch based variable inductor. With regard to the conventional variable inductor, in a case where the MISFET M1 is ON, with a sufficiently high frequency, most of the current between the terminals A and B does not pass through inductors L32 and L33, but passes through the MISFET M1. Therefore, a series resistance of M1 is added to a resistance between the terminals A and B, and the series resistance increases.

On the other hand, in the variable inductor of the present exemplary embodiment, even when the MISFET M1 is ON, only a current that passes along a current path α, of the current between the terminals A and B, passes through the MISFET M1, and a current that passes along a current path β does not pass through the MISFET M1. Therefore, the amount of increase of the series resistance is small compared to the conventional variable inductor shown in FIG. 4. Furthermore, referring to FIG. 1, with regard to the variable inductor of the first exemplary embodiment, the current that passes along the current path α does not pass through the MISFET M1, and of the current that passes along the current path β, only current that branches into current path γ passes through the MISFET M1. Therefore, the amount of increase of the series resistance in the variable inductor (FIG. 1) of the first exemplary embodiment is smaller than that of the variable inductor (FIG. 3) of the present exemplary embodiment.

Here, by computing series impedance ZAB between the terminals A and B by a circuit simulator, the influence of the series resistance on the MISFET M1 is investigated. Here, the series resistance of the inductor that was ignored in FIGS. 1, 3, and 4, is given consideration.

Figure 5A:
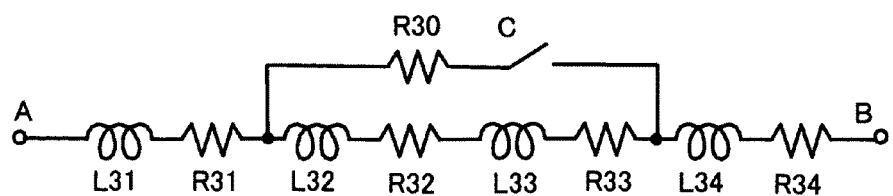
FIGS. 5A, 5B and 5C are circuit diagrams showing an equivalent circuit of a variable inductor giving consideration to series resistance.
Figure 5B:
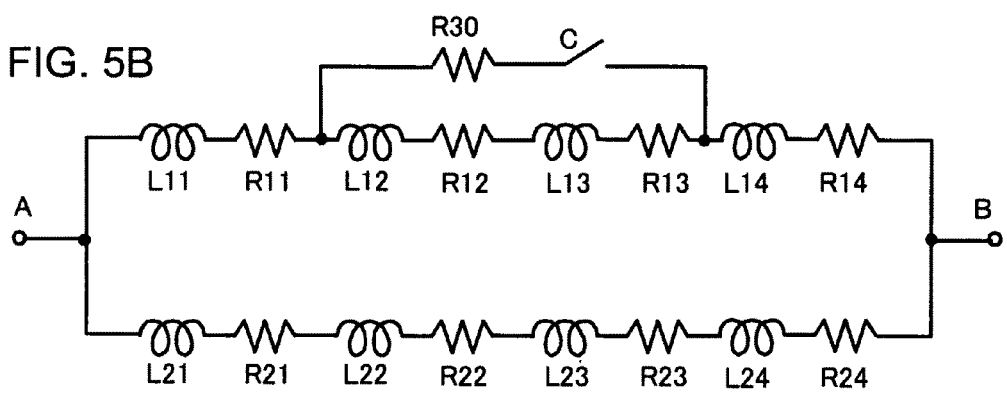
Figure 5C:
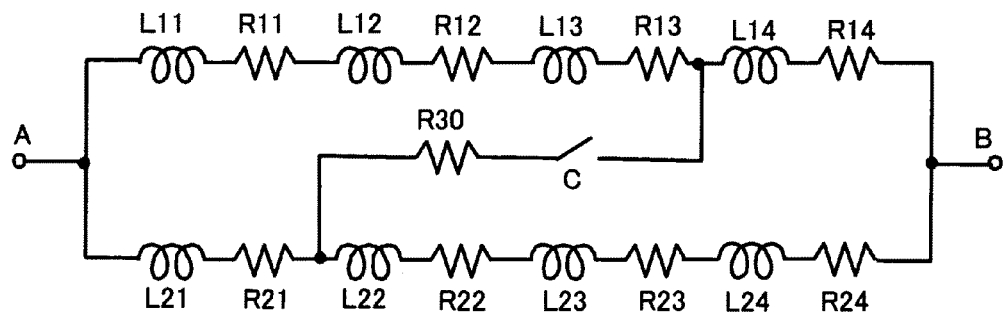

FIGS. 5A-5C are circuit diagrams showing an equivalent circuit of the variable inductor that gives consideration to series resistance. FIG. 5A is a circuit diagram showing an equivalent circuit of the conventional variable inductor, FIG. 5B is a circuit diagram showing an equivalent circuit of the variable inductor of the second exemplary embodiment, and FIG. 5C is a circuit diagram showing an equivalent circuit of the variable inductor of the first exemplary embodiment. The MISFET M1 is represented by a series resistance R30 and a switch C.

Here, it is assumed that $$L11=L14=L21=L24=2*L31=2*L34,$$

$$L12=L13=L22=L23=2*L32=2*L33,$$

$$R11=R14=R21=R24=2*R31=2*R34,$$

$$R12=R13=R22=R23=2*R32=2*R33. \quad (5)$$

In this case, in a case where the switch C is OFF, the series impedances in FIGS. 5A to 5C are equal.

Moreover, it is assumed that $$L31+L32=(L11+L12)/2=L\text{fix},$$

$$R31+R32=(R11+R12)/2=R\text{fix},$$

$$R30=R\text{fix}. \quad (6)$$

Furthermore, since the series inductance of the inductor and the series resistance are proportional to wiring length of the inductor, a ratio of the series inductance and the series resistance is constant, that is, $$L32/R32=L31/R31 \quad (7)$$

Figure 6:
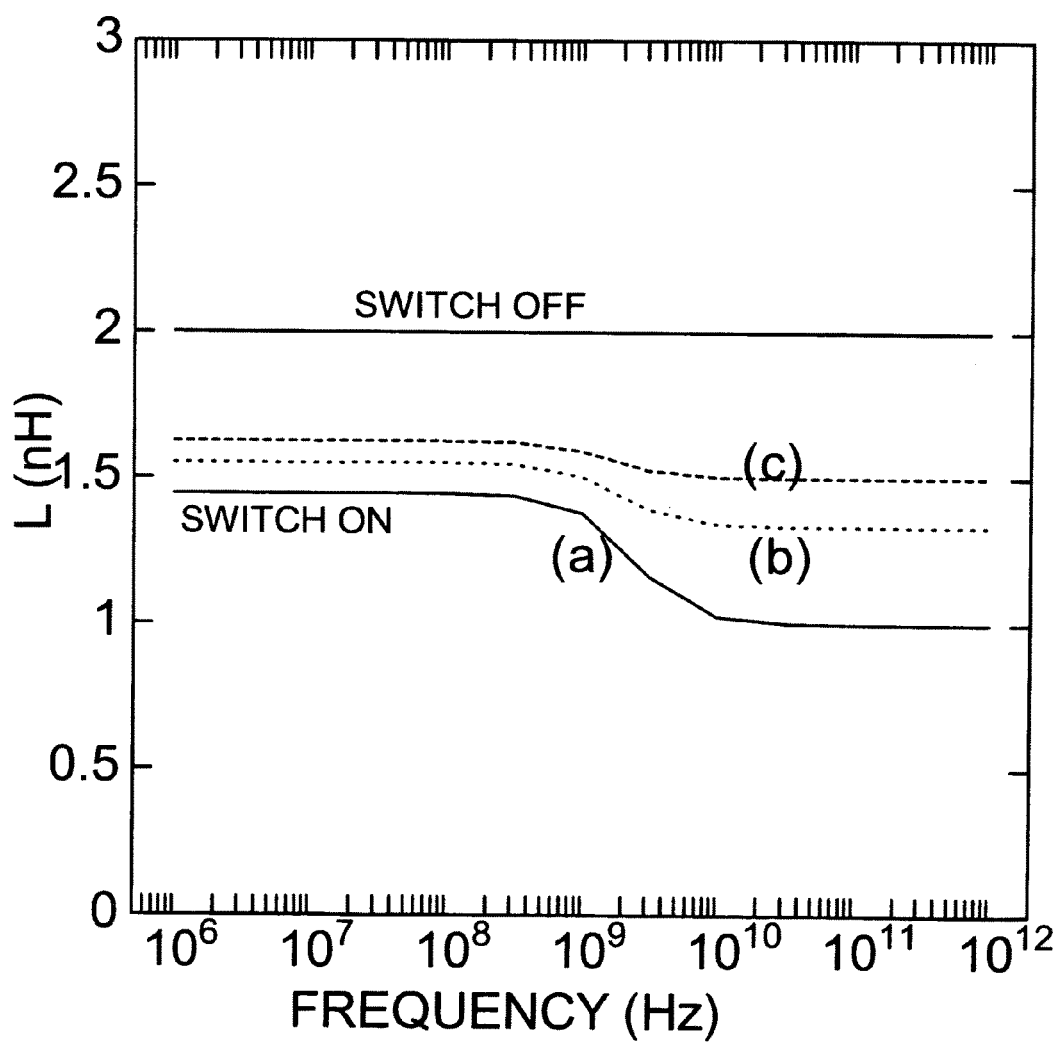
FIG. 6 is a diagram showing frequency dependency of series inductance of a variable inductor.

FIG. 6 shows frequency dependency of the series inductance of the variable inductor shown in FIGS. 5A-5C. Here, the resistance R30=10Ω, the resistance Rfix=5Ω, the inductance Lfix=1 nH, L11=L12, and R11=R12. Furthermore, the series inductance between the terminals A and B was computed from the following expression, using the series impedance ZAB:

$$L = \frac{\text{Im}(Z_{AB})}{2\pi f} \quad (8)$$

Here, f is frequency.

Referring to FIG. 6, in a case where the switch is OFF, the series inductance of any variable inductor is 2 nH. On the other hand, in a case where the switch in ON, a current bypass effect by the switch is small at low frequencies not greater than 1 GHz, and inductance change amount is small, but at high frequencies not less than 10 GHz, since the inductor is completely bypassed by the switch, the series inductance decreases, the series inductance of the conventional variable inductor (FIG. 6 (a)) is 1 nH, the series inductance of the variable inductor of the second exemplary embodiment (FIG. 6 (b)) is 4/3 nH, and the series inductance of the variable inductor of the first exemplary embodiment (FIG. 6 (c)) is 1.5 nH.

A ratio of an imaginary component Im(ZAB) and a real component Re(ZAB) of a series impedance ZAB between the terminals A and B is $$Q = \frac{\text{Im}(Z_{AB})}{\text{Re}(Z_{AB})} \quad (9)$$

Which is referred to as a Q value, and is an efficiency indicator of the inductor. The Q value is large when the series resistance is small and the series inductance is large, and indicates that an inductor has low losses.

Figure 7:
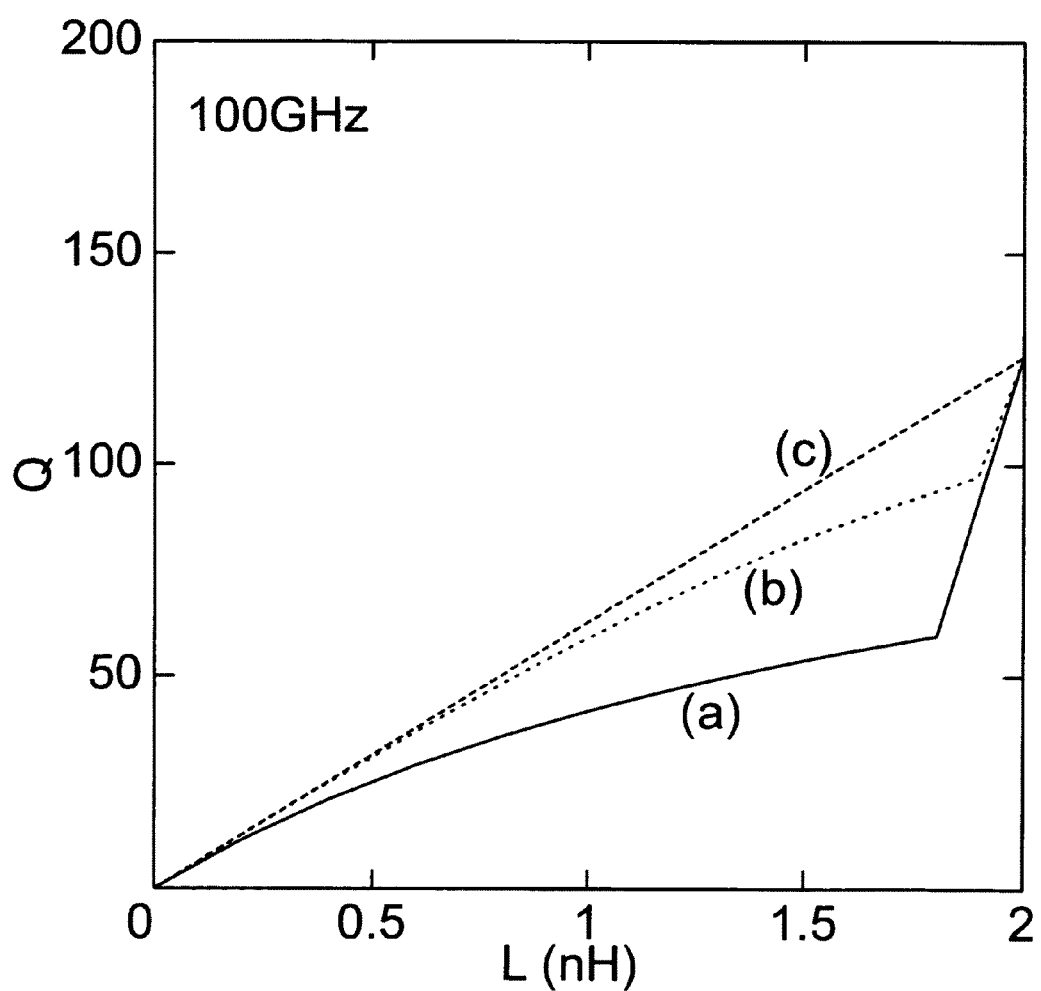
FIG. 7 is a diagram showing a relationship between series inductance of a variable inductor and a Q value.

FIG. 7 is a diagram showing a relationship between the series inductance L (Equation 8) of a variable inductor and the Q value. In FIG. 7, the inductance of the inductor L12 changes from 0 to 2*Lfix. Furthermore, FIG. 7 shows the Q value in a case where the frequency is sufficiently large, 100 GHz, and the series inductance is decreasing. In FIG. 7, (a) shows the Q value of a conventional variable inductor, (b) shows the Q value of the variable inductor of the present exemplary embodiment, and (c) shows the Q value of the variable inductor of the first exemplary embodiment.

Referring to FIG. 7, if L12=2*Lfix, since the two ends of the switch are respectively shorted at terminals A and B, the series inductance is 0; and if L32 decreases, the series inductance increases, and at maximum becomes 2 nH, the same as when the switch C is OFF. In this case, if Q values at locations where the series inductance values are equal are compared, (a)<(b)<(c), and comparing with the conventional variable inductor (FIG. 7 (a)), a high Q value is obtained for the variable inductor (FIG. 7 (b)) of the present exemplary embodiment and the variable inductor (FIG. 7 (c)) of first exemplary embodiment, and losses are small.

In FIG. 6 and FIG. 7, mutual inductance between the inductors is ignored. However, in a case where inductors are disposed close to each other or are disposed in a concentric form, mutual inductance between the inductors occurs. Consequently, Q values are compared in a case where mutual inductance is taken into consideration.

Figure 8A:
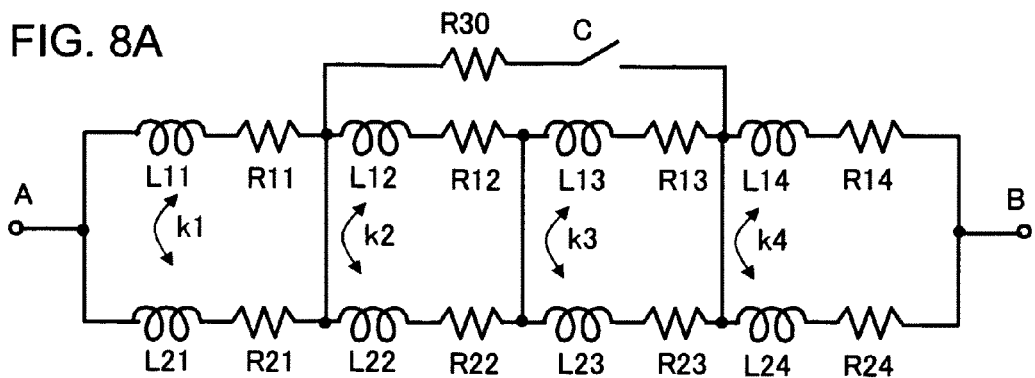
FIGS. 8A, 8B and 8C are circuit diagrams showing an equivalent circuit of a variable inductor giving consideration to series resistance and mutual inductance.
Figure 8B:
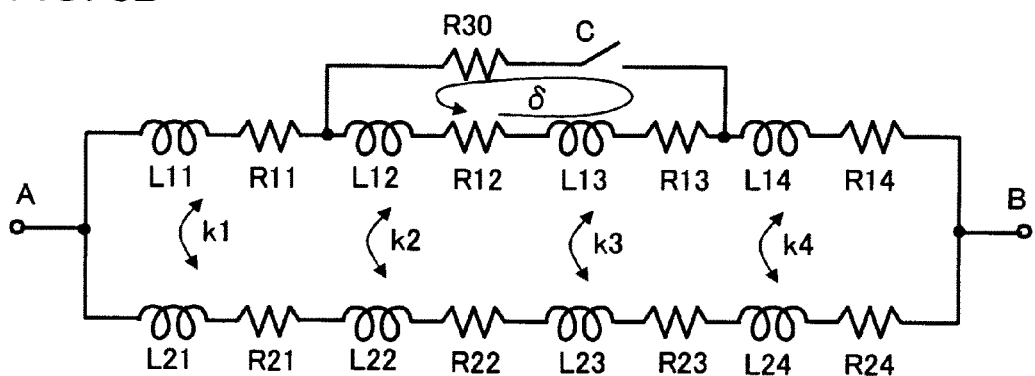
Figure 8C:
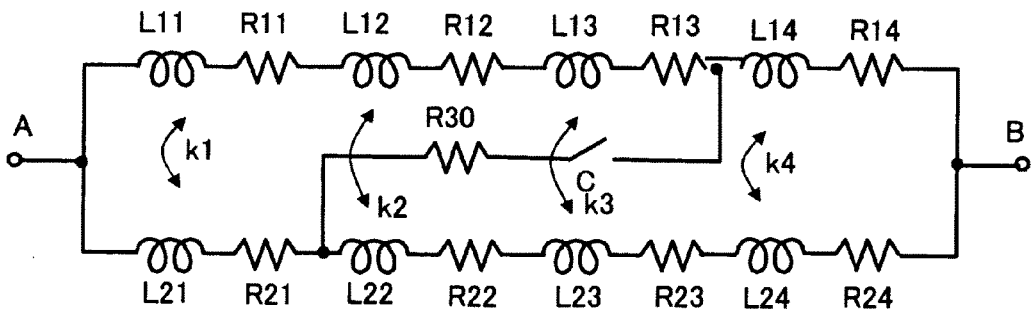

FIGS. 8A-8C are circuit diagrams showing an equivalent circuit of a variable inductor giving consideration to series resistance and mutual inductance. In FIG. 8A, the inductors L31 to L34 and resistors R31 to R34 of FIG. 5A are respectively replaced by parallel connections of the inductors L11 to L14 and L21 to L24, and the resistors R11 to R14 and R21 to R24. Respective mutual inductances exist between the inductors L11 and L21, the inductors L12 and L22, the inductors L13 and L23, and the inductors L14 and L24.

For example, in FIG. 8B, in a case where there is no mutual inductance, if frequency is sufficiently high when the switch C is ON, a current does not flow to the inductors L12 and L13. However, in a case where there is mutual inductance, since an induced current flows from the inductors L22 and L23 to the inductors L12 and L13, even if the switch C is ON, current flows to the inductors L12 and L13. The current that flows to the inductors L12 and L13 flows in a loop 8 via the resistor R30 and the switch C, an eddy current loss occurs, and the Q value is decreased. The Q value in a case where mutual inductance is present in this way is computed similarly to FIG. 7.

Here, using a hypothesis of Equation (5) in FIG. 8A to 8C, the inductance and resistance are the same as in FIG. 6, and coupling coefficients k1 to k4 are each 0.5. A case where the coupling coefficient value is 0.5 occurs when inductor wires are disposed to be in close proximity, such as when the wires are superimposed on a chip.

Figure 9:
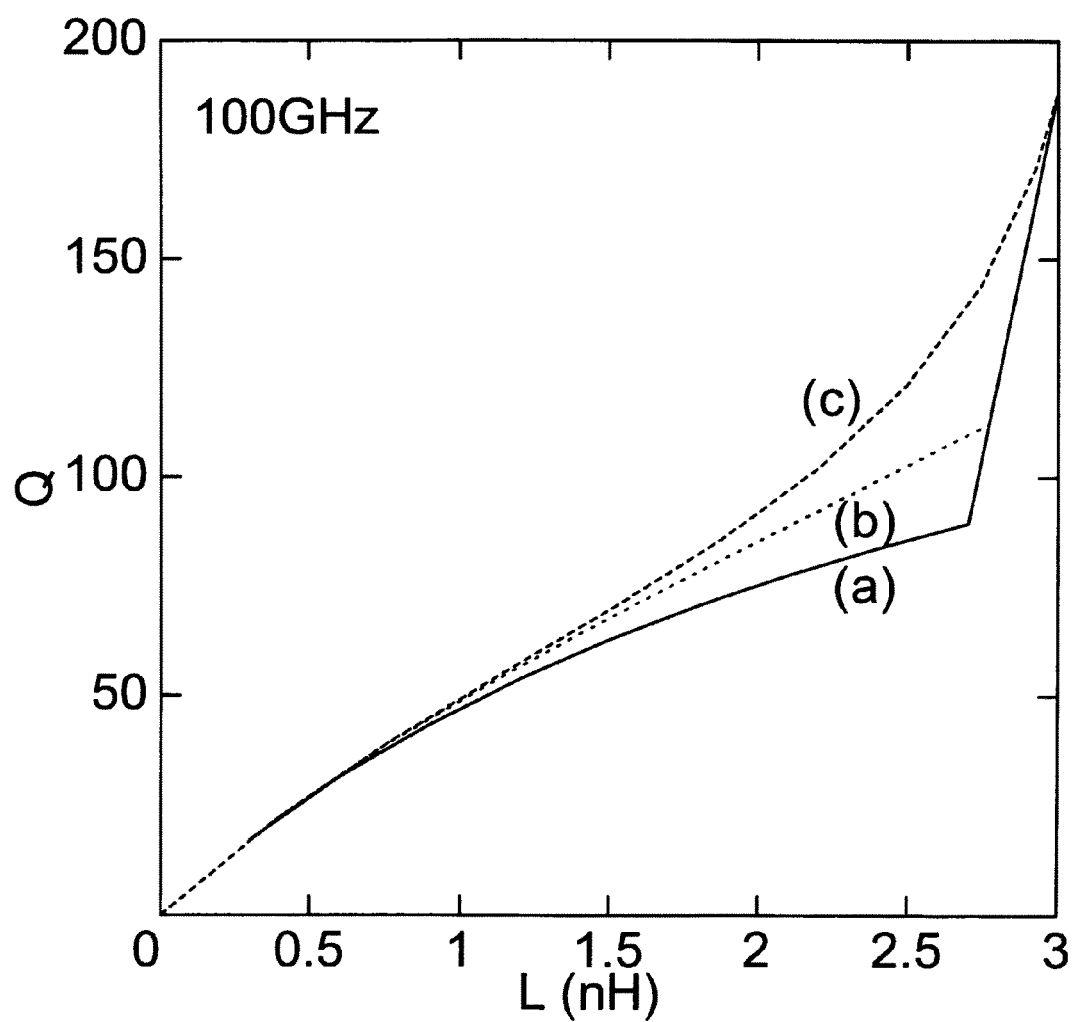
FIG. 9 is a diagram showing a relationship between series inductance of a variable inductor giving consideration to mutual inductance, and a Q value.

FIG. 9 is a diagram showing a relationship between series inductance of the variable inductor giving consideration to mutual inductance, and the Q value. FIG. 9 shows the Q value when a value of the inductor L12 is varied from 0 to 2*Lfix. Referring to FIG. 9, similar to a case of FIG. 7, (a)<(b)<(c), and compared to the conventional variable inductor (FIG. 9 (a)), a high Q value is obtained for the variable inductor (FIG. 9 (b)) of the present exemplary embodiment and the variable inductor (FIG. 9 (c)) of the first exemplary embodiment. That is, in a case giving consideration to mutual inductance, compared to the conventional variable inductor, a high Q value is obtained for the variable inductor of the present exemplary mode.

In a case where the inductor of the first exemplary embodiment shown in FIG. 1 is used in a differential circuit, with regard to the terminal A and the terminal B, voltage changes in a reverse direction, and voltage at a midpoint of the terminals A and B is approximately constant. Therefore, if nodes X and Y of the inductors L1 and L2 are set to a midpoint of the terminals A and B, change of potential difference between a control terminal CNT of the MISFET M1 and the nodes X and Y decreases, and it is possible to inhibit change of the series resistance of the MISFET M1, and to reduce an influence of parasitic capacitance of the MISFET M1.

Third Exemplary Embodiment

Figure 10:
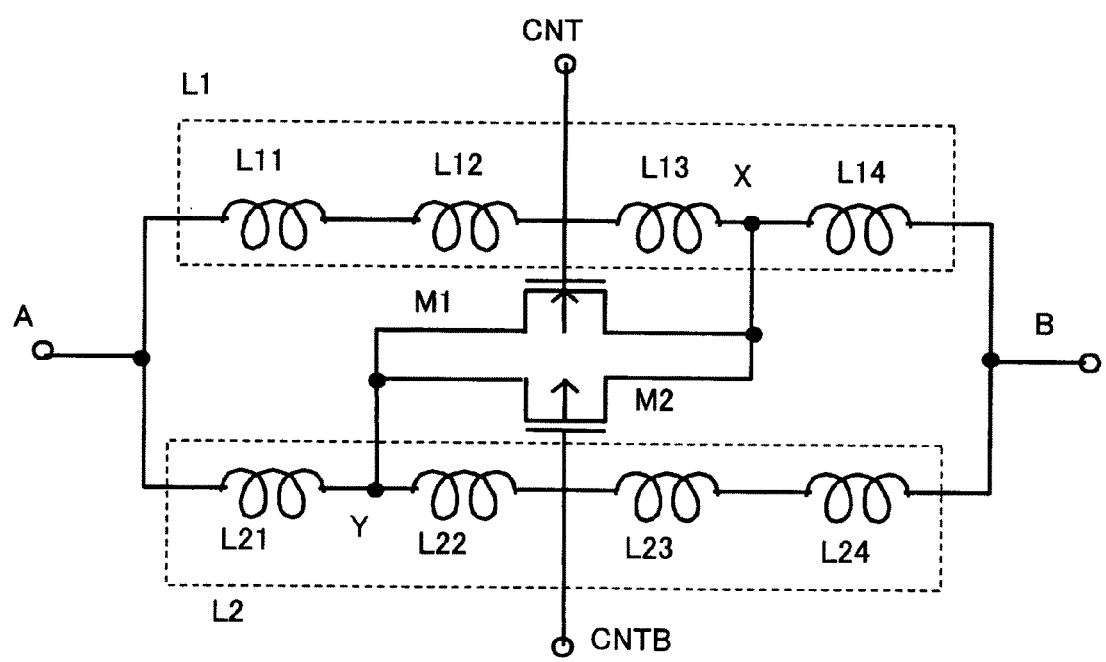
FIG. 10 is a circuit diagram showing an equivalent circuit of a variable inductor according to a third exemplary embodiment.

A description is given concerning a variable inductor according to a third exemplary embodiment, making reference to the drawings. FIG. 10 is a circuit diagram showing an equivalent circuit of the variable inductor according to the present exemplary embodiment.

Referring to FIG. 10, the variable inductor has two inductors L1 and L2. The inductors L1 and L2, both ends of which are shorted at terminals A and B, function as a whole as one inductor. Referring to FIG. 10, 8 inductors L11 to L14 and L21 to L24 are shown. Inductors L11 to L14 and L21 to L24 are part of one line of inductors L1 and L2, respectively connected in series.

In FIG. 10, a connection part of inductors L13 and L14 is a node X, a connection part of inductors L21 and L22 is a node Y, and a source and a drain of MISFETs M1 and M2 are connected to these nodes. MISFETs M1 and M2 are MISFETs of mutually reverse polarity, and control signals received by control terminals CNT and CNTB also have mutually reverse polarity.

If the potential of the terminals A and B of the variable inductor changes, since the potential difference between the control terminals CNT and CNTB and the terminals A and B changes, and the series resistance of the MISFETs M1 and M2 changes, the series resistance of the inductor also changes. However, by the MISFETs M1 and M2 having reverse polarities, in a case where an ON resistance of the MISFET M1 increases, an ON resistance of the MISFET M2 decreases, so that it is possible to decrease the change in resistance of a parallel connection of the MISFETs M1 and M2. Here, a case with a switch element as a MISFET has been shown, but a bipolar element or a MESFET may also be used as another element that can be realized on-chip.

Fourth Exemplary Embodiment

Figure 11:
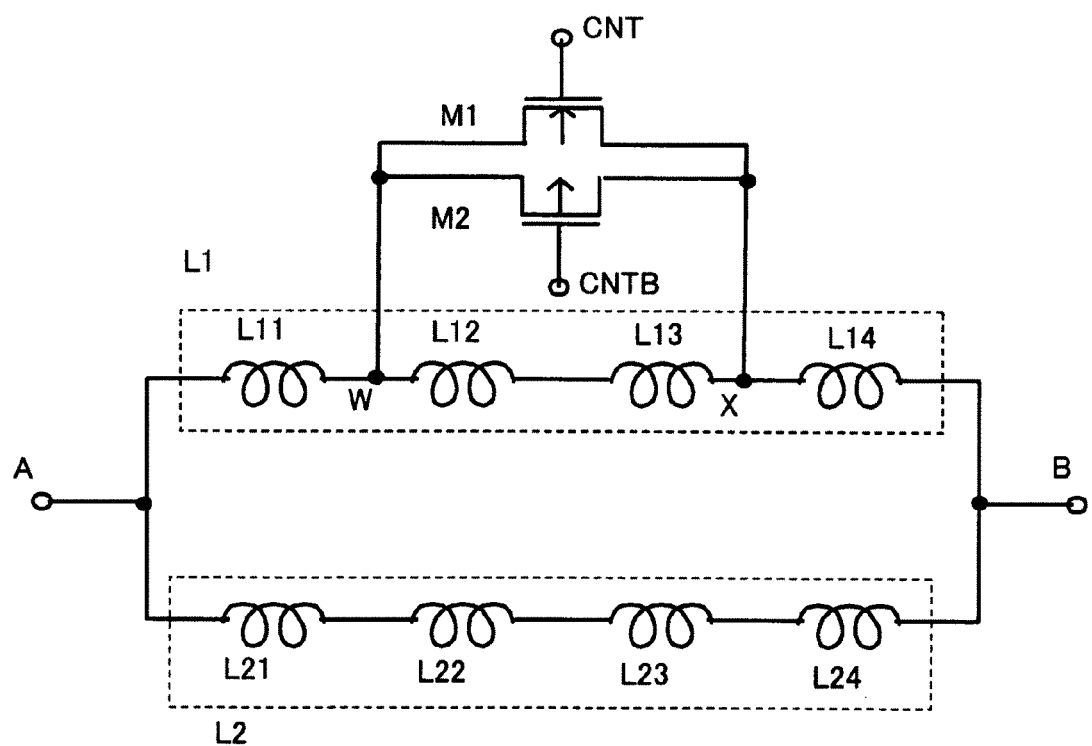
FIG. 11 is a circuit diagram showing an equivalent circuit of a variable inductor according to a fourth exemplary embodiment.

A description is given concerning a variable inductor according to a fourth exemplary embodiment, making reference to the drawings. FIG. 11 is a circuit diagram showing an equivalent circuit of the variable inductor according to the present exemplary embodiment.

Referring to FIG. 11, the variable inductor of the present exemplary embodiment has two inductors L1 and L2, similar to the variable inductor of the third exemplary embodiment shown in FIG. 10. The inductors L1 and L2, both ends of which are shorted at terminals A and B, function as a whole as one inductor. Furthermore, inductors L11 to L14 and L21 to L24 are part of one line of inductors L1 and L2, respectively connected in series.

A connection part of inductors L13 and L14 is a node X, a connection part of inductors L11 and L12 is a node W, and a source and a drain of MISFETs M1 and M2 are connected to these nodes. The MISFETs M1 and M2 are MISFETs of mutually reverse polarity, and control signals received by control terminals CNT and CNTB also have mutually reverse polarity.

If the potential of the terminals A and B of the variable inductor changes, since the potential difference between the control terminals CNT and CNTB and the terminals A and B changes, and the series resistance of the MISFETs M1 and M2 changes, the series resistance of the inductor also changes. However, by the MISFETs M1 and M2 having reverse polarities, in a case where an ON resistance of the MISFET M1 increases, an ON resistance of the MISFET M2 decreases, so that it is possible to decrease the change in resistance of a parallel connection of the MISFETs M1 and M2. Here, a case with a switch element as a MISFET has been shown, but a bipolar element or a MESFET may also be used as another element that can be realized on-chip.

Fifth Exemplary Embodiment

Figure 12:
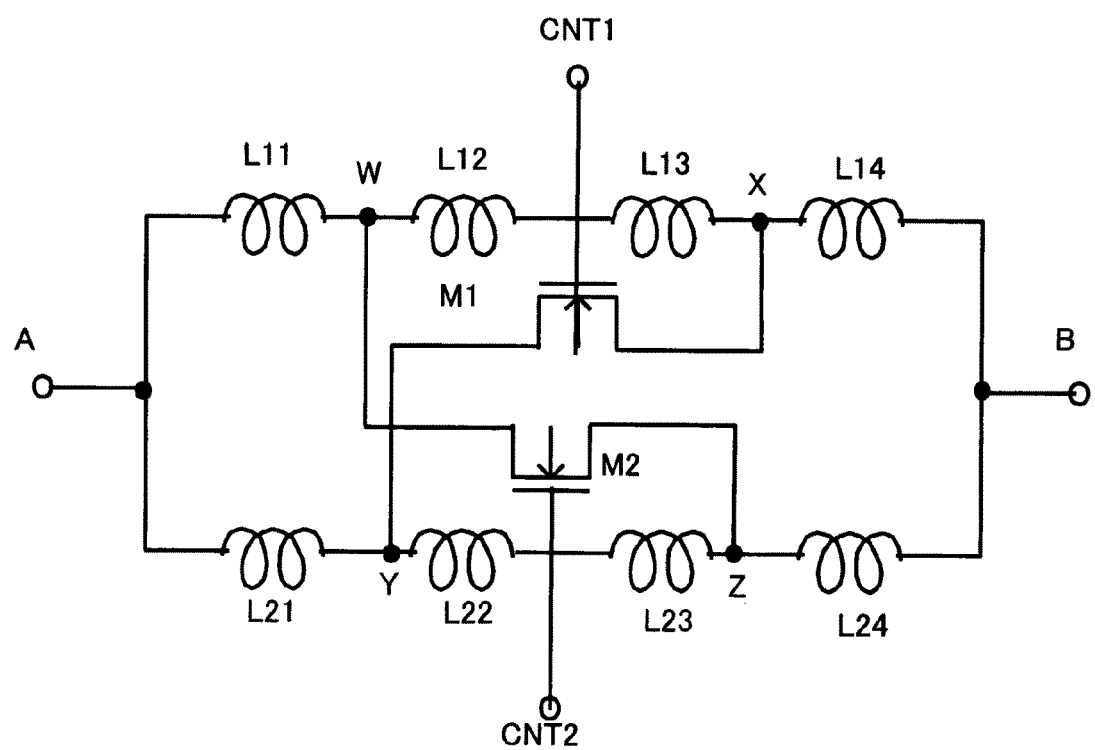
FIG. 12 is a circuit diagram showing an equivalent circuit of a variable inductor according to a fifth exemplary embodiment.

A description is given concerning a variable inductor according to a fifth exemplary embodiment, making reference to the drawings. FIG. 12 is a circuit diagram showing an equivalent circuit of the variable inductor according to the present exemplary embodiment.

Referring to FIG. 12, the variable inductor of the present exemplary embodiment has two inductors L1 and L2, similar to the variable inductor of the first exemplary embodiment shown in FIG. 1. The inductors L1 and L2, both ends of which are shorted at terminals A and B, function as a whole as one inductor. Furthermore, inductors L11 to L14 and L21 to L24 are part of one line of inductors L1 and L2, respectively connected in series.

A connection part of the inductors L13 and L14 is a node X, a connection part of the inductors L21 and L22 is a node Y, and a source and a drain of a MISFET M1 are connected to these nodes. In the same way, a connection part of the inductors L11 and L12 is a node W, a connection part of the inductors L23 and L24 is a node Z, and a source and a drain of a MISFET M2 are connected to these nodes.

According to four combinations of the MISFETs M1 and M2 being ON and OFF, the inductance of the variable inductor can be changed in four ways. In FIG. 12, a case is shown in which 2 nodes, with regard to the inductors L1 and L2, are selected, and 2 MISFETs are connected. In the same way, by selecting n nodes, with regard to the inductors L1 and L2 and connecting n MISFETs, it is possible to change the inductance of the variable inductor in 2 to the power of n ways.

Sixth Exemplary Embodiment

Figure 13:
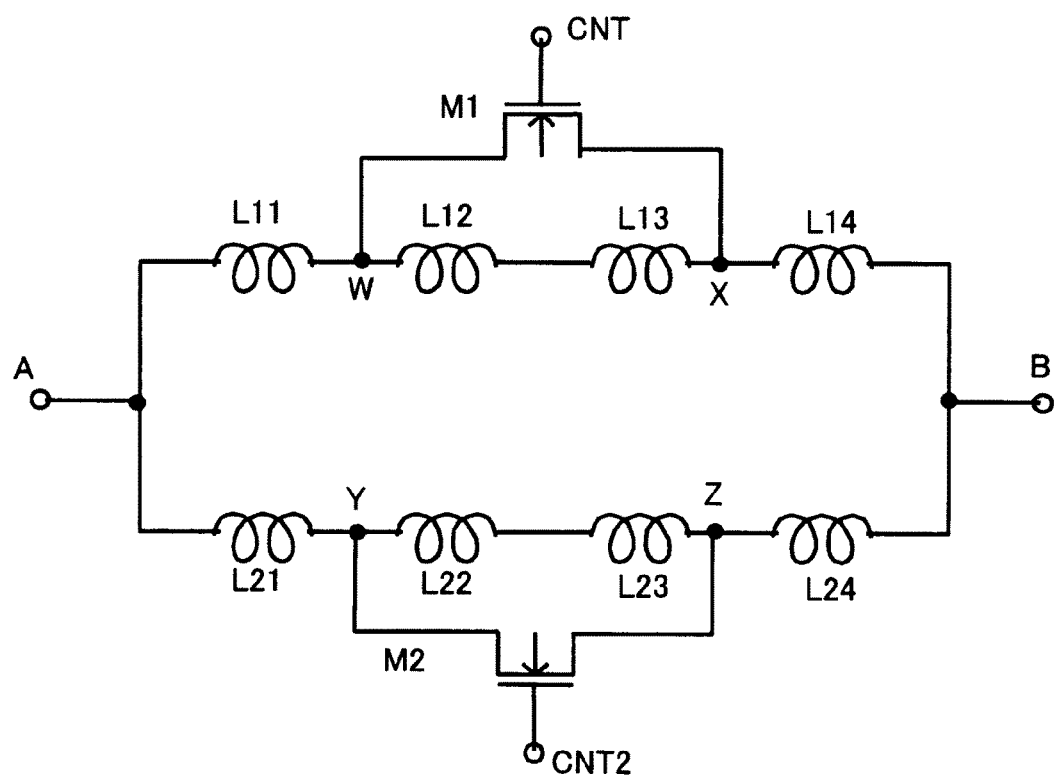
FIG. 13 is a circuit diagram showing an equivalent circuit of a variable inductor according to a sixth exemplary embodiment.

A description is given concerning a variable inductor according to a sixth exemplary embodiment, making reference to the drawings. FIG. 13 is a circuit diagram showing an equivalent circuit of the variable inductor according to the present exemplary embodiment.

Referring to FIG. 13, the variable inductor of the present exemplary embodiment has two inductors L1 and L2, the same as the variable inductor of the second exemplary embodiment shown in FIG. 3. The inductors L1 and L2, both ends of which are shorted at terminals A and B, function as a whole as one inductor. Furthermore, inductors L11 to L14 and inductors L21 to L24 are part of one line of inductors L1 and L2, respectively connected in series.

A connection part of inductors L13 and L14 is a node X, a connection part of inductors L11 and L12 is a node W, and a source and a drain of a MISFET M1 are connected to these nodes. In the same way, a connection part of the inductors L21 and L22 is a node Y, a connection part of the inductors L23 and L24 is a node Z, and a source and a drain of a MISFET M2 are connected to these nodes.

According to four combinations of the MISFETs M1 and M2 being ON and OFF, the inductance of the variable inductor can be changed in four ways. In FIG. 13, it is possible to realize the inductance in four ways, by the 2 MISFETs. In the same way, it is possible to change the inductance of the variable inductor in 2 to the power of n ways, by n MISFETs.

Seventh Exemplary Embodiment

Figure 14:
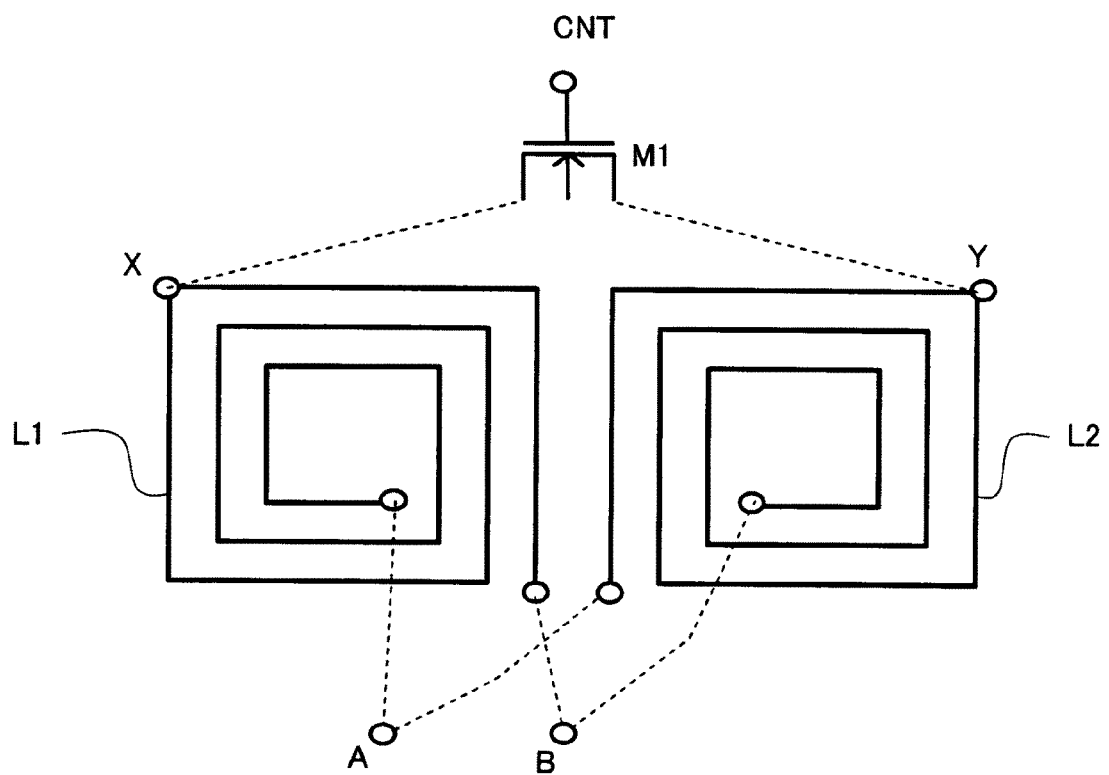
FIG. 14 is a diagram showing a layout of a variable inductor according to a seventh exemplary embodiment.

A description is given concerning a variable inductor according to a seventh exemplary embodiment, making reference to the drawings. FIG. 14 is a diagram showing a layout of a variable inductor according to the present exemplary embodiment.

Referring to FIG. 14, the variable inductor has two inductors L1 and L2. The inductors L1 and L2 are disposed symmetrically. Among terminals of both ends of the inductors L1 and L2, those that are at non-symmetrical positions are connected to terminals A and B, and the two inductors L1 and L2 are connected in parallel.

In addition, a node along wiring of the inductor L1 is node X, a node along wiring of the inductor L2 is node Y, and a source and a drain of a MISFET M1 are connected to these nodes.

According to the MISFET M1 being ON or OFF, inductance between the terminals A and B changes. In this way, with regard to the inductors L1 and L2 themselves, even when characteristics viewed from the two ends are not equal, that is, for non-symmetrical inductors, with the inductors L1 and L2 combined as a whole, characteristics viewed from the terminals A and B are equal, and it is possible to configure symmetrical inductors.

Eighth Exemplary Embodiment

Figure 15:
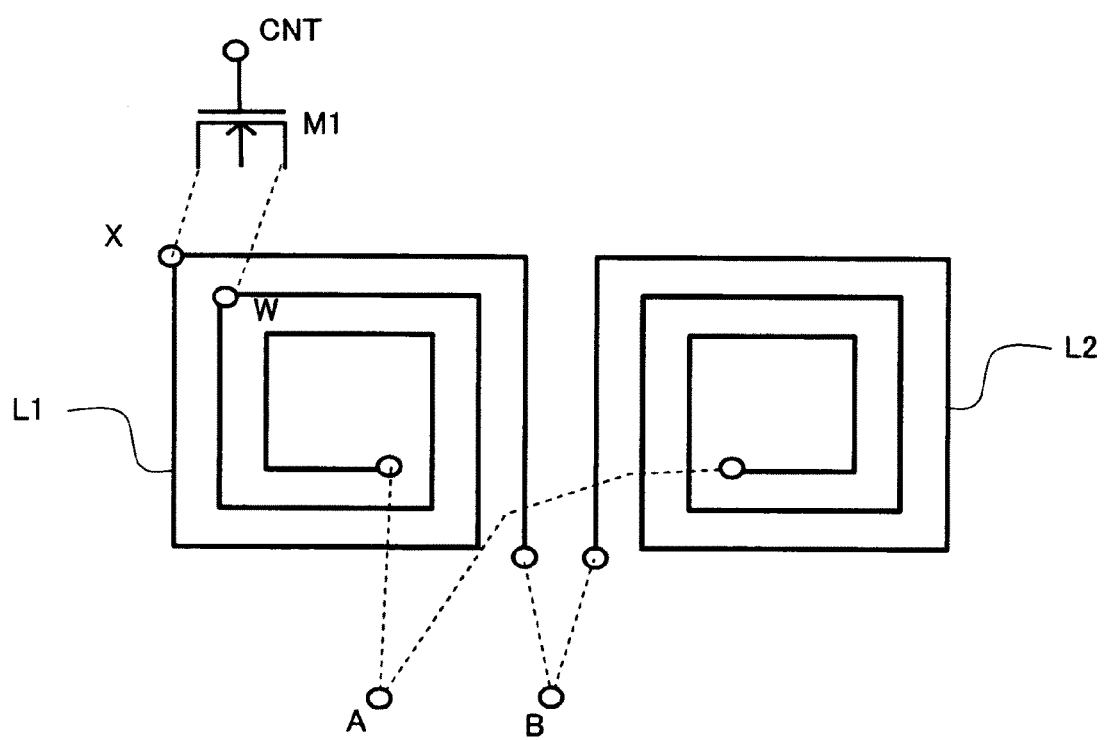
FIG. 15 is a diagram showing a layout of a variable inductor according to an eighth exemplary embodiment.

A description is given concerning a variable inductor according to an eighth exemplary embodiment, making reference to the drawings. FIG. 15 is a diagram showing a layout of a variable inductor according to the present exemplary embodiment.

Referring to FIG. 15, the variable inductor has two inductors L1 and L2. The inductors L1 and L2 are disposed symmetrically. Among terminals of both ends of the inductors L1 and L2, those that are at symmetrical positions are connected to terminals A and B, and the two inductors L1 and L2 are connected in parallel.

In addition, settings along wiring of the inductor L1 are node W and node X, and a source and a drain of a MISFET M1 are connected to these nodes. In this case, according to the MISFET M1 being ON or OFF, inductance between the terminals A and B of the variable inductor changes.

Ninth Exemplary Embodiment

Figure 16:
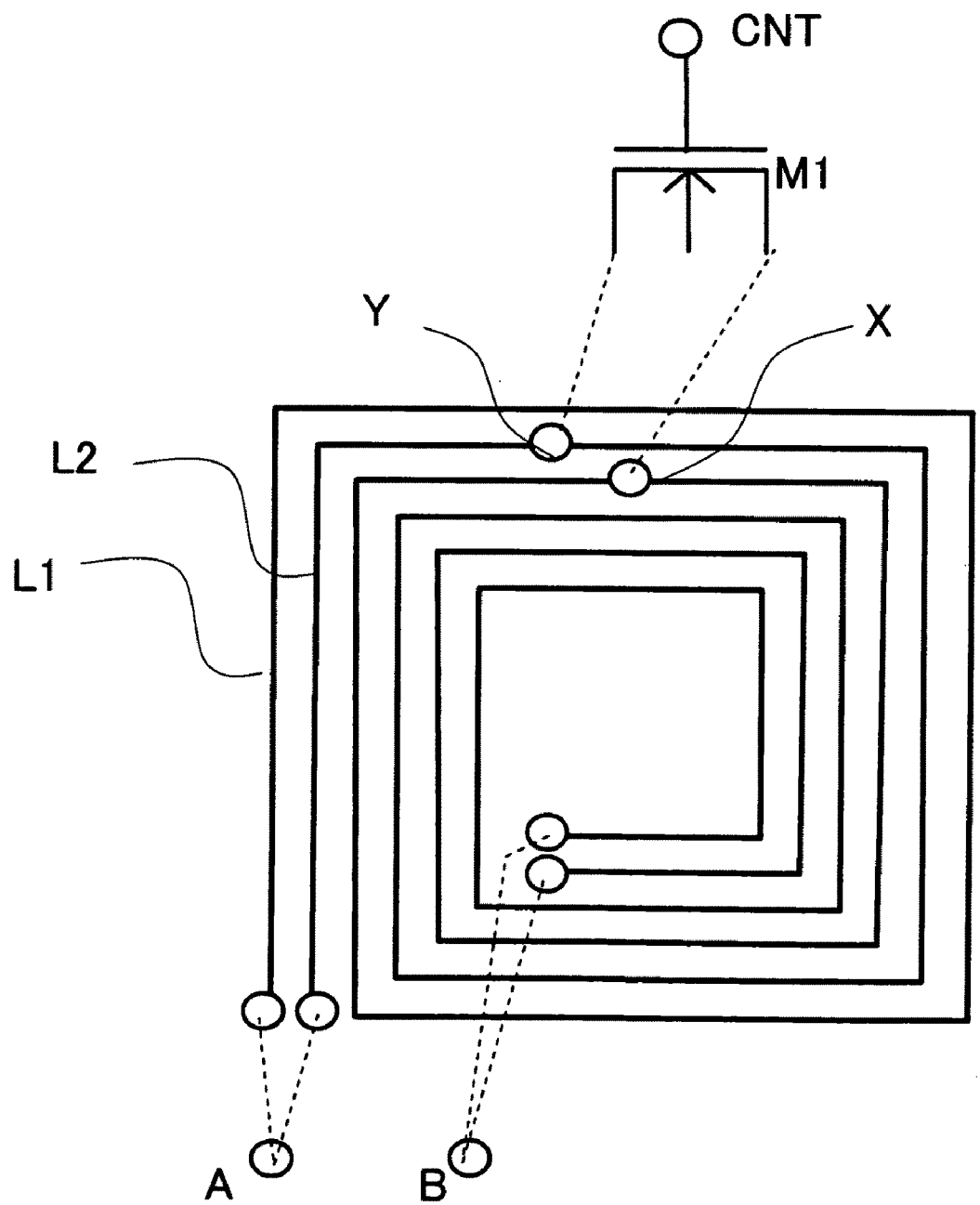
FIG. 16 is a diagram showing a layout of a variable inductor according to a ninth exemplary embodiment.

A description is given concerning a variable inductor according to a ninth exemplary embodiment, making reference to the drawings. FIG. 16 is a diagram showing a layout of the variable inductor according to the present exemplary embodiment.

Referring to FIG. 16, the variable inductor has two inductors L1 and L2. The inductors L1 and L2 are respectively disposed in a concentric form. Among terminals of both ends of the inductors L1 and L2, those that are adjacent are connected to terminals A and B, and the two inductors L1 and L2 are connected in parallel.

In addition, a node along wiring of the inductor L1 is node X, a node along wiring of the inductor L2 is node Y, and a source and a drain of a MISFET M1 are connected to these nodes. In this case, according to the MISFET M1 being ON or OFF, inductance between the terminals A and B of the variable inductor changes.

Tenth Exemplary Embodiment

Figure 17:
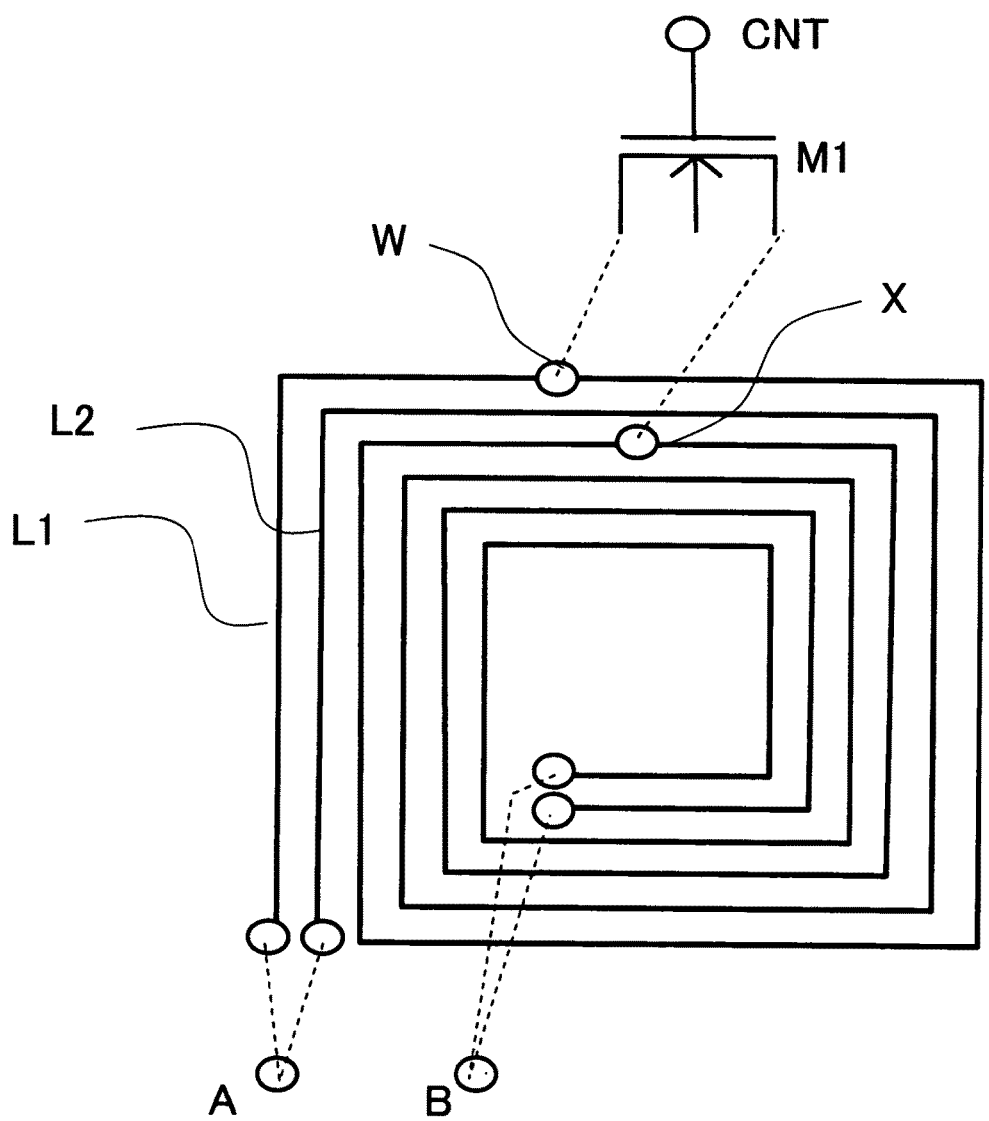
FIG. 17 is a diagram showing a layout of a variable inductor according to a tenth exemplary embodiment.

A description is given concerning a variable inductor according to a tenth exemplary embodiment, making reference to the drawings. FIG. 17 is a diagram showing a layout of the variable inductor according to the present exemplary embodiment.

Referring to FIG. 17, the variable inductor has two inductors. The inductors L1 and L2 are disposed in a concentric form. Among terminals of both ends of the inductors L1 and L2, those that are adjacent are connected to terminals A and B, and the two inductors L1 and L2 are connected in parallel.

In addition, nodes along wiring of the inductor L1 are nodes W and X, and a source and a drain of a MISFET M1 are connected to these nodes. In this case, according to the MISFET M1 being ON or OFF, inductance between the terminals A and B of the variable inductor changes.

Eleventh Exemplary Embodiment

Figure 18:
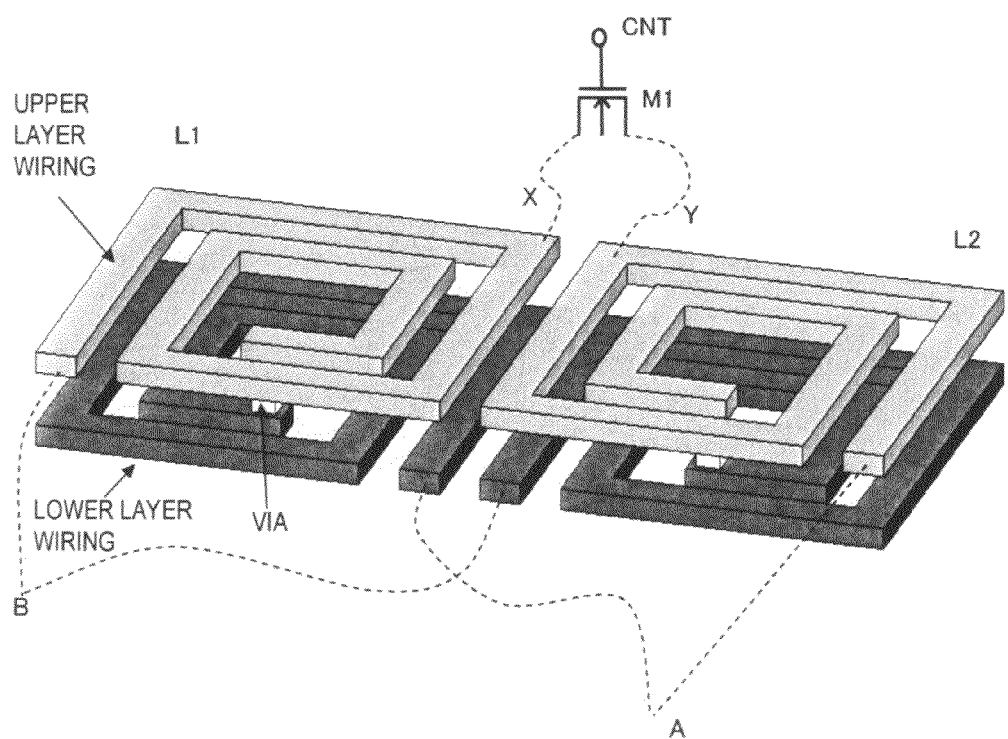
FIG. 18 is a perspective view of a variable inductor according to an eleventh exemplary embodiment of the invention.

A description is given concerning a variable inductor according to an eleventh exemplary embodiment, making reference to the drawings. FIG. 18 is a perspective view of the variable inductor according to the present exemplary embodiment.

Referring to FIG. 18, the variable inductor has two inductors L1 and L2 in a 3-dimensional structure. The inductors L1 and L2 are disposed symmetrically. The inductors L1 and L2 respectively connect inductors of a plurality of wiring layers. Although FIG. 18 shows a case of two layers of upper layer wiring and lower layer wiring, inductors of more wiring layers may be connected.

Among terminals of both ends of the inductors L1 and L2, those that are at non-symmetrical positions are connected to terminals A and B, and the two inductors L1 and L2 are connected in parallel. In addition, a node along wiring of the inductor L1 is node X, a node along wiring of the inductor L2 is node Y, and a source and a drain of a MISFET M1 are connected to these nodes.

In this case, according to the MISFET M1 being ON or OFF, inductance between the terminals A and B of the variable inductor changes.

Twelfth Exemplary Embodiment

Figure 19:
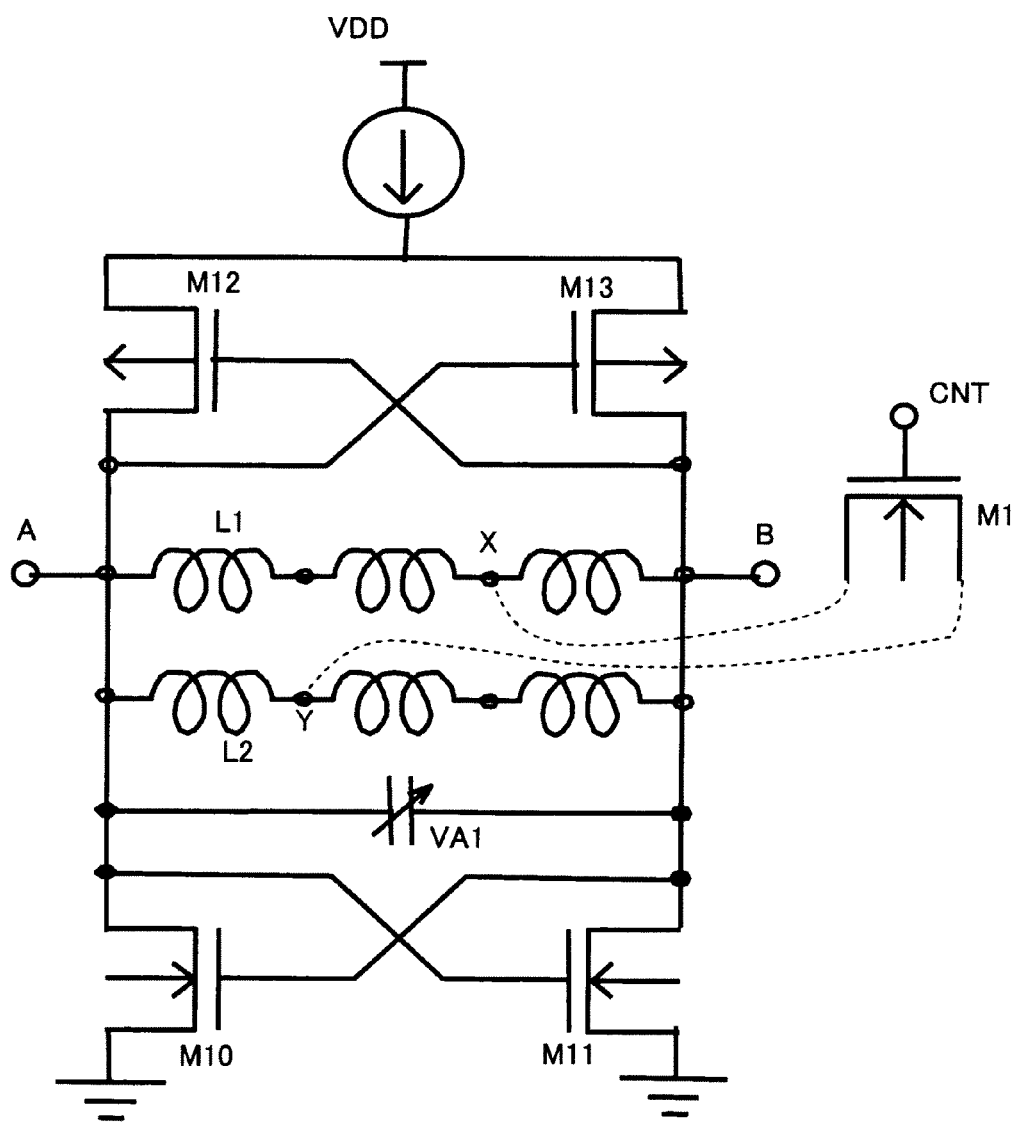
FIG. 19 is a circuit diagram of an oscillator circuit according to a twelfth exemplary embodiment.
Figure 20:
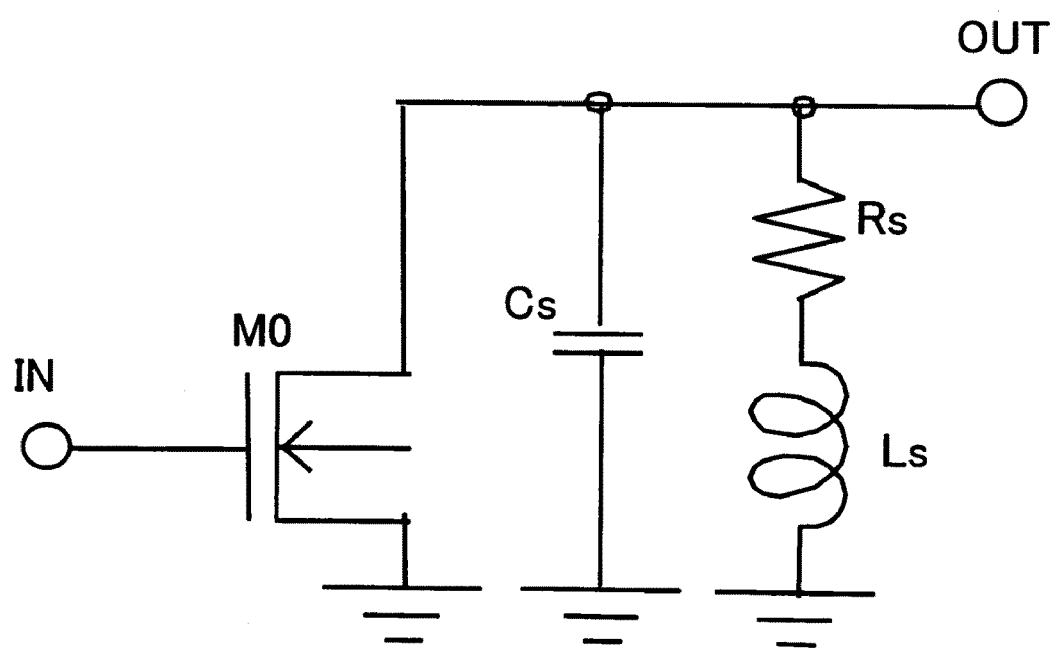
FIG. 20 is a circuit diagram of an amplifier that uses a resonant circuit.
Figure 21:
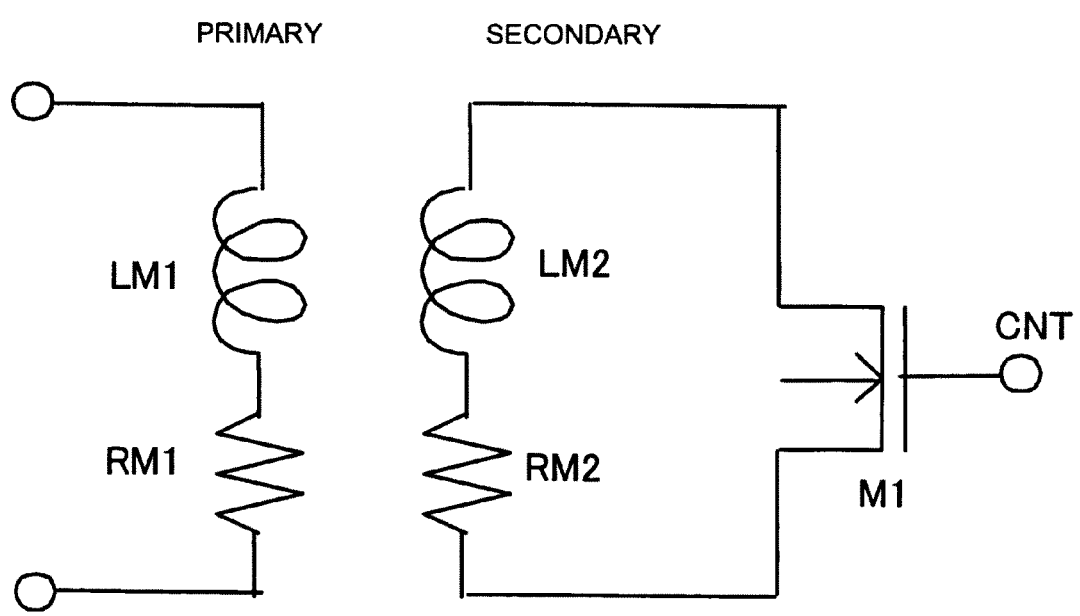
FIG. 21 is a circuit diagram showing an equivalent circuit of a conventional magnetic field based variable inductor.
Figure 22:
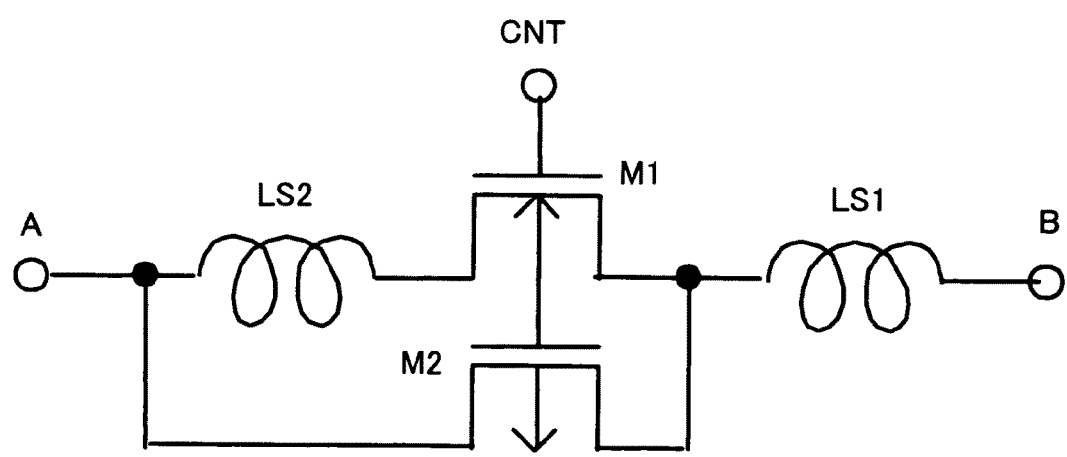
FIG. 22 is a circuit diagram showing an equivalent circuit of a conventional switch based variable inductor.

A description is given concerning an oscillator circuit according to a twelfth exemplary embodiment, making reference to the drawings. FIG. 19 is a circuit diagram showing the oscillator circuit according to the present exemplary embodiment.

Referring to FIG. 19, in the oscillator circuit, a variable inductor according to the present invention is applied to a voltage controlled oscillator. In FIG. 19, the oscillator circuit has a configuration in which, for an inverter circuit configured by MISFETs M10 to M13, at terminals A and B, two inductors L1 and L2 and a variable capacitance device VA1 are connected.

In this case, according to a MISFET M1 being ON or OFF, series inductance between the terminals A and B changes, and it is possible to change the frequency of the oscillator, independently of capacitance of the variable capacitance device VA1. Furthermore, when the oscillator is operated, voltage of the terminals A and B is changed to a reverse direction, and voltage at a midpoint of terminals A and B is approximately constant. Therefore, if nodes X and Y of the inductor L1 and L2 are set to the midpoint of the terminals A and B, change of potential difference between a control terminal CNT of the MISFET M1 and the nodes X and Y decreases, it is possible to inhibit change of a series resistance of the MISFET M1, and it is possible to reduce the influence of parasitic capacitance of the MISFET M1.

The above description has been given based on the exemplary embodiments, but the present invention is not limited to the abovementioned exemplary embodiments. In the framework of entire disclosure of the present invention (including the claims), and based on its basic technological idea, exemplary embodiments or examples of the present invention may be changed and/or adjusted. Also it should be noted that in the framework of the claims of the present invention, any combinations or selections of various elements disclosed herein are possible. That is, needless to say, it is understood by those skilled in the art that various changes or modifications can be made to the present invention based on the disclosure of the present invention including the claims and the technological idea of the present invention.

What is claimed is:

1. A variable inductor, comprising:
   a first inductor comprising two ends connected to a first terminal and a second terminal;

a second inductor comprising two ends connected to said first terminal and said second terminal;
a first node provided on said first inductor;
a second node provided on said second inductor; and
a switch element that switches between a conductive state and a non-conductive state between said first node and said second node, said switch element performing specific switching to provide different lengths of inductor coils,
wherein said first node is provided on said first inductor at a first connection part between a first part of a first line of inductors and a second part of the first line of inductors, the first inductor comprising the first line of inductors connected in series, and
wherein said second node is provided on said second inductor at a second connection part between a first part of a second line of inductors and a second part of the second line of inductors, the second inductor comprising the second line of inductors connected in series.

2. The variable inductor according to claim 1, wherein an inductance of said first inductor and an inductance of said second inductor are equal, and
wherein an inductance between said first terminal and said first node, and an inductance between said second terminal and said second node are equal.

3. The variable inductor according to claim 1, wherein said switch element comprises one of a MISFET, a MESFET, and a bipolar transistor.

4. The variable inductor according to claim 1, wherein said switch element is connected in parallel to two elements, whose polarity is mutually different, of any one of a MISFET, a MESFET, and a bipolar transistor, and
wherein signals of a reverse polarity are received by control terminals of said two elements whose polarity is mutually different.

5. The variable inductor according to claim 1, wherein said first inductor and said second inductor comprise a mutually symmetrical form.

6. The variable inductor according to claim 1, wherein said first inductor and said second inductor are respectively disposed in a concentric form.

7. The variable inductor according to claim 6, wherein the first inductor and the second inductor are arranged symmetrically and connected in parallel.

8. The variable inductor according to claim 1, wherein said first inductor and said second inductor are respectively arranged extending over a plurality of metal wiring layers.

9. A semiconductor device comprising a circuit including said variable inductor according to claim 1, on a semiconductor substrate.

10. An oscillator circuit, comprising:
said variable inductor according to claim 1;
a capacitor element comprising two ends, one end being connected to said first terminal and an other end being connected to said second terminal; and
an inverter circuit that oscillates at a resonant frequency due to said variable inductor and said capacitor element.

11. A semiconductor device comprising said oscillator circuit according to claim 10, said oscillator circuit being provided on a semiconductor substrate.

12. The variable inductor according to claim 1, wherein the first part of the first line of inductors and the second part of the first line of inductors each comprise a different inductance value according to different lengths of the inductors.

13. The variable inductor according to claim 1, wherein the first part of the second line of inductors and the second part of the second line of inductors each comprise a different inductance value according to different lengths of the inductors.

14. A variable inductor, comprising:
a first inductor comprising two ends connected to a first terminal and a second terminal;
a second inductor comprising two ends connected to said first terminal and said second terminal;
a first node provided on said first inductor;
a second node provided at a position different from said first node on said first inductor; and
a switch element that switches between a conductive state and a non-conductive state between said first node and said second node, said switch element performing specific switching to provide different lengths of inductor coils,
wherein said first node is provided on said first inductor at a first connection part between a first part of a first line of inductors and a second part of the first line of inductors, the first inductor comprising the first line of inductors connected in series,
wherein said second node is provided on said first inductor at a second connection part between the second part of the first line of inductors and a third part of the first line of inductors, and
wherein the second inductor comprises the second line of inductors connected in series.

15. The variable inductor according to claim 14, wherein an inductance of said first inductor and an inductance of said second inductor are equal, and
wherein an inductance between said first terminal and said first node and an inductance between said second terminal and said second node are equal.

16. A semiconductor device comprising a circuit having said variable inductor according to claim 14.

17. A variable inductor, comprising:
a first inductor comprising two ends connected to a first terminal and a second terminal;
a second inductor comprising two ends connected to said first terminal and said second terminal;
n switch elements, where n is a natural number;
n nodes provided on said first inductor; and
n nodes provided on said second inductor,
wherein an i-th switch element, where i is a natural number from 1 to n, among said n switch elements switches between a conductive state and a non-conductive state between an i-th node counted from said first terminal of said first inductor and an i-th node counted from said second terminal of said second inductor, said i-th switch element performs specific switching to provide different lengths of inductor coils,
wherein said i-th node counted from said first terminal of said first inductor is provided on said first inductor at a first connection part between a first part of a first line of inductors and a second part of the first line of inductors, the first inductor comprising the first line of inductors connected in series, and
wherein said i-th node counted from said second terminal of said second inductor is provided on said second inductor at a second connection part between a first part of a second line of inductors and a second part of the second line of inductors, the second inductor comprising the second line of inductors connected in series.

18. The variable inductor according to claim 17, wherein a plurality of switch elements among said n switch elements are simultaneously in a conductive state or are simultaneously in a non-conductive state.

19. The variable inductor according to claim 17, wherein said n is an even number, and
   wherein said i-th switch element, where i is a natural number from 1 to n/2, among the n switch elements switches between a conductive state and a non-conductive state between an i-th node counted from the first terminal of the first inductor and an i-th node counted from the second terminal of the first inductor, and an (i+n/2)-th switch element, where i is a natural number from 1 to n/2, among the n switch elements switches between a conductive state and a non-conductive state between an i-th node counted from the first terminal of the second inductor and an i-th node counted from the second terminal of the second inductor.

20. A semiconductor device comprising a circuit having said variable inductor according to claim 19.

21. A semiconductor device comprising a circuit having said variable inductor according to claim 17.

22. A variable inductor apparatus, comprising:
   a first row of inductors;
   a second row of inductors arranged in parallel with the first row of inductors between a first terminal and a second terminal;
   a first node provided in between two inductors of the first row of inductors;
   a second node provided on the second row of inductors; and
   a switch provided between the first node and the second node to connect the first node and the second node to perform a specific switching to provide different lengths of the first and second inductor rows,
   wherein said first node is provided on said first row of inductors at a first connection part between a first part of a first line of inductors and a second part of the first line of inductors, the first row of inductors comprising the first line of inductors connected in series, and
   wherein said second node is provided on said second row of inductors at a second connection part between a first part of a second line of inductors and a second part of the second line of inductors, the second row of inductors comprising the second line of inductors connected in series.

23. A variable inductor apparatus, comprising:
   a first inductor configured in a concentric form;
   a second inductor configured in a concentric form arranged symmetrically and connected in parallel with the first inductor between a first terminal and a second terminal;
   a first node provided in the first inductor;
   a second node provided in the first inductor; and
   a switch provided between the first node and the second node to connect the first node and the second node to perform specific switching to provide different inductor coil lengths of the first inductor,
   wherein said first node is provided on said first inductor at a first connection part between a first part of a first line of inductors and a second part of the first line of inductors, the first inductor comprising the first line of inductors connected in series,
   wherein said second node is provided on said first inductor at a second connection part between the second part of the first line of inductors and a third part of the third line of inductors, and
   wherein the second inductor comprises the second line of inductors connected in series.

* * * * *